United States Patent
Tao et al.

(10) Patent No.: US 11,217,148 B2
(45) Date of Patent: Jan. 4, 2022

(54) SHIFT REGISTER UNIT, DRIVING METHOD, GATE DRIVER ON ARRAY AND DISPLAY DEVICE

(71) Applicants: Hefei BOE Optoelectronics Technology Co., Ltd., Anhui (CN); BOE Technology Group Co., Ltd., Beijing (CN)

(72) Inventors: Jian Tao, Beijing (CN); Dong Wang, Beijing (CN); Hongmin Li, Beijing (CN); Shufeng Wang, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 355 days.

(21) Appl. No.: 16/475,777

(22) PCT Filed: Dec. 14, 2018

(86) PCT No.: PCT/CN2018/121116
§ 371 (c)(1),
(2) Date: Jul. 3, 2019

(87) PCT Pub. No.: WO2019/205663
PCT Pub. Date: Oct. 31, 2019

(65) Prior Publication Data
US 2021/0335196 A1    Oct. 28, 2021

(30) Foreign Application Priority Data

Apr. 25, 2018 (CN) .......................... 201810380946.3

(51) Int. Cl.
*G09G 3/20* (2006.01)

(52) U.S. Cl.
CPC ... *G09G 3/2092* (2013.01); *G09G 2300/0426* (2013.01); *G09G 2310/0286* (2013.01);
(Continued)

(58) Field of Classification Search
CPC .... G09G 3/20; G09G 3/36; G09G 2310/0286; G09G 2310/0291; G09G 2310/08;
(Continued)

(56) References Cited

U.S. PATENT DOCUMENTS 7,420,536 B2    9/2008   Jang et al.
9,001,108 B2    4/2015   Jang
(Continued)

FOREIGN PATENT DOCUMENTS

CN    101079243 A    11/2007
CN    102800289 A    11/2012
(Continued)

OTHER PUBLICATIONS

Apr. 11, 2019—(CN) First Office Action Appn 201810380946.3 with English Translation.
(Continued)

*Primary Examiner* — Nelson M Rosario
(74) *Attorney, Agent, or Firm* — Banner & Witcoff, Ltd.

(57) ABSTRACT

A shift register unit, a driving method, a gate driver on array and a display device. The shift register unit includes an input sub-circuit, an output sub-circuit, a pull-down control sub-circuit and a pull-down sub-circuit; the input sub-circuit is configured for inputting an input signal from an input signal terminal to a pull-up node under a control of a first clock signal; the output sub-circuit is configured for inputting a second clock signal to an output terminal under a control of a pull-up node; the pull-down control sub-circuit is configured for inputting the first clock signal to a pull-down node under a control of the first clock signal, and inputting a
(Continued)

power supply signal to the pull-down no under the control of the pull-up node; the pull-down sub-circuit is configured for inputting the power supply signal to the output terminal under a control of the pull-down node.

20 Claims, 5 Drawing Sheets

(52) U.S. Cl.
CPC ............... *G09G 2310/0294* (2013.01); *G09G 2310/061* (2013.01); *G09G 2310/08* (2013.01)

(58) Field of Classification Search
CPC ........... G09G 2330/021; G09G 3/3677; G09G 5/003; G11C 19/28; G11C 19/287
See application file for complete search history.

(56) References Cited

U.S. PATENT DOCUMENTS

| | | |
|---|---|---|
| 9,703,413 B2 | 7/2017 | Zhang et al. |
| 9,767,916 B2 | 9/2017 | Ma |
| 9,905,155 B2 | 2/2018 | Zhang et al. |
| 10,311,961 B2 | 6/2019 | Zhang et al. |
| 2011/0228893 A1 | 9/2011 | Tobita et al. |
| 2016/0071614 A1 | 3/2016 | Lee |
| 2018/0181243 A1* | 6/2018 | Tsunashima ........ G06F 3/04166 |
| 2019/0114980 A1* | 4/2019 | Kim .................. G02F 1/136213 |

FOREIGN PATENT DOCUMENTS

| | | |
|---|---|---|
| CN | 103151010 A | 6/2013 |
| CN | 103247255 A | 8/2013 |
| CN | 104282285 A | 1/2015 |
| CN | 104360781 A | 2/2015 |
| CN | 104616616 A | 5/2015 |
| CN | 104992662 A | 10/2015 |
| CN | 106548747 A | 3/2017 |
| CN | 106782285 A | 5/2017 |
| CN | 107146568 A | 9/2017 |
| CN | 108288451 A | 7/2018 |
| KR | 101012972 B1 | 2/2011 |

OTHER PUBLICATIONS

Dec. 6, 2019—(CN) Second Office Action Appn 201810380946.3 with English Translation.

* cited by examiner

SHIFT REGISTER UNIT, DRIVING METHOD, GATE DRIVER ON ARRAY AND DISPLAY DEVICE

CROSS REFERENCE TO RELATED APPLICATIONS

The application is a U.S. National Phase Entry of International Application No. PCT/CN2018/121116 filed on Dec. 14, 2018, designating the United States of America and claiming priority to Chinese Patent Application No. 201810380946.3 filed on Apr. 25, 2018. The present application claims priority to and the benefit of the above-identified applications and the above-identified applications are incorporated by reference herein in their entirety.

TECHNICAL FIELD

The present disclosure relates to the field of display technology, in particular to a shift register unit, a driving method, a gate driver on array and a display device.

BACKGROUND

When displaying images, a display device uses a gate driver on array (abbreviated as: GOA) to scan the pixel array. The gate driver on array (also called shift register) comprises a plurality of cascaded shift register units, each of which corresponds to a row of pixel units in the pixel array. Progressive scanning of the rows of pixel units in the pixel array of the display device is realized by the plurality of shift register units so as to display images.

However, as the number of pixel units in the display device increases, the number of rows that the gate driver on array is required to scan within the time of a frame increases, and the demand for ultra-narrow bezel display devices requires that the area of shift register units becomes smaller. In related art, there is a shift register unit, which usually controls the level of the potential of the circuit output signal through a plurality of transistors and capacitors.

However, in related art, each shift register unit includes many elements, resulting in a great area occupied by the gate driver on array in the display device.

SUMMARY

At least one embodiment of the present disclosure provides a shift register unit, which includes: an input sub-circuit connected to an input signal terminal, a first clock signal terminal and a first node, the input sub-circuit being configured for inputting an input signal from the input signal terminal to a first node under a control of a first clock signal from the first clock signal terminal; an output sub-circuit connected to a second clock signal terminal, the first node and an output terminal, the output sub-circuit being configured for inputting a second clock signal from the second clock signal terminal to the output terminal under a control of the first node; a control sub-circuit connected to the first clock signal terminal, the first node, a power supply terminal and a second node, the control sub-circuit being configured for inputting the first clock signal to the second node under the control of the first clock signal, and for inputting a power supply signal from the power supply terminal to the second node under a control of the first node; and a holding sub-circuit connected to the power supply terminal, the second node and the output terminal, the holding sub-circuit being configured for inputting the power supply signal to the output terminal under the control of the second node.

Optionally, the input sub-circuit comprises: a first transistor; a gate electrode of the first transistor is connected to the first clock signal terminal, a first electrode of the first transistor is connected to the input signal terminal, and a second electrode of the first transistor is connected to the first node.

Optionally, the output sub-circuit comprises: a second transistor; a gate electrode of the second transistor is connected to the first node, a first electrode of the second transistor is connected to the second clock signal terminal, and a second electrode of the second transistor is connected to the output terminal.

Optionally, the output sub-circuit further comprises: a first capacitor; an end of the first capacitor is connected to the first node, and a remaining end of the first capacitor is connected to the output terminal.

Optionally, the control sub-circuit comprises: a first control sub-circuit and a second control sub-circuit; the first control sub-circuit is connected to the first node, the second node and the power supply terminal, and the first control sub-circuit is configured for inputting the power supply signal to the second node under the control of the first node; the second control sub-circuit is connected to the first clock signal terminal and the second node, and the second control sub-circuit is configured for inputting the first clock signal to the second node under the control of the first clock signal.

Optionally, the first control sub-circuit comprises: a third transistor; a gate electrode of the third transistor is connected to the first node, a first electrode of the third transistor is connected to the power supply terminal, and a second electrode of the third transistor is connected to the second node; the second control sub-circuit comprises: a fourth transistor; a gate electrode and a first electrode of the fourth transistor are both connected to the first clock signal terminal, and a second electrode of the fourth transistor is connected to the second node.

Optionally, the control sub-circuit further comprises: a second capacitor; an end of the second capacitor is connected to the second node, and a remaining end of the second capacitor is connected to the power supply terminal.

Optionally, the holding sub-circuit comprises: a fifth transistor; a gate electrode of the fifth transistor is connected to the second node, a first electrode of the fifth transistor is connected to the power supply terminal, and a second electrode of the fifth transistor is connected to the output terminal.

At least one embodiment of the present disclosure provides a method of driving a shift register unit, the method being configured for driving any one of the shift register units described above and the method comprising: in a potential control phase, inputting the first clock signal at an effective potential to the first clock signal terminal, and inputting the input signal at the effective potential to the input signal terminal, so that the input sub-circuit inputs the input signal at the effective potential to the first node under the control of the first clock signal; in an output phase, inputting the second clock signal at an effective potential to the second clock signal terminal, so that the output sub-circuit inputs the second clock signal at the effective potential to the output terminal under the control of the first node at the effective potential; in a reset phase, inputting the second clock signal at an invalid potential to the second clock signal terminal, so that the output sub-circuit inputs the second clock signal at the invalid potential to the output terminal under the control of the first node at the effective potential; in a holding phase, inputting the first clock signal at the effective potential to the first clock signal terminal, inputting the input signal at the invalid potential to the input signal terminal, and inputting the power supply signal at the invalid potential to the power supply terminal, so that the input sub-circuit inputs the input signal at the invalid potential to the first node under the control of the first clock signal; the control sub-circuit inputs the first clock signal at the effective potential to the second node under the control of the first clock signal; and the holding sub-circuit inputs the power supply signal at the invalid potential to the output terminal under the control of the second node.

Optionally, in the case where the control sub-circuit comprises a first control sub-circuit and a second control sub-circuit, the method further comprises: in the potential control phase, inputting, by the first control sub-circuit, a power supply signal at an invalid potential to the second node under a control of a first node at an effective potential, and inputting, by the second control sub-circuit, a first clock signal at the effective potential to the second node under the control of a first clock signal at an effective potential to control an potential of the second node to be an invalid potential.

Optionally, in the case where the control sub-circuit comprises a first control sub-circuit and a second control sub-circuit, the method further comprises: in the output phase and the reset phase, inputting, by the first control sub-circuit, a power supply signal at an invalid potential to the second node under the control of the first node at an effective potential.

Optionally, in the case where the control sub-circuit comprises a first control sub-circuit and a second control sub-circuit, the method further comprises: in the holding phase, inputting, by the second control sub-circuit, the first clock signal at an effective potential to the second node under the control of the first clock signal at an effective potential.

At least one embodiment of the present disclosure provides a gate driver on array, which includes: a plurality of cascaded shift register units according to any one of the above-mentioned shift register units.

Optionally, in the plurality of cascaded shift register units, an output terminal of a $j^{th}$ shift register unit is connected to an input signal terminal of a $(j+1)^{th}$ shift register unit, and j is a positive integer.

At least one embodiment of the present disclosure provides a display device, which includes the above-mentioned gate driver on array as described above.

At least one embodiment of the present disclosure provides a non-volatile storage medium storing a computer program which, when executed by a processor, performs the above-mentioned control method of the shift register unit.

BRIEF DESCRIPTION OF THE DRAWINGS

In order to explain the technical solutions in the embodiments of the present disclosure more clearly, the drawings which need to be used as described in the embodiments will be introduced briefly herein below. Obviously, the drawings described below are only related to some embodiments of the present disclosure. Other drawings may be further obtained by a person of ordinary skill in the art with reference to these drawings without any inventive work.

DETAILED DESCRIPTION

Figure 1:
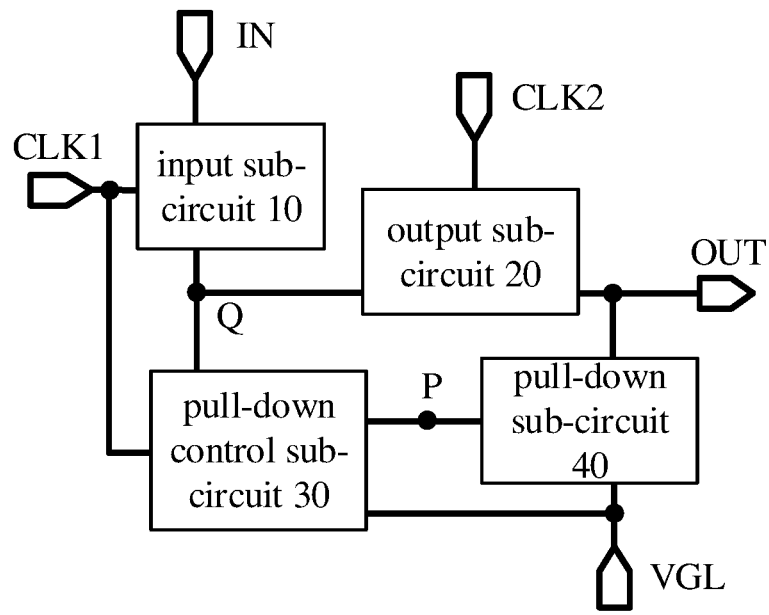
FIG. 1 is a schematic structural diagram of a shift register unit provided by the embodiments of the present disclosure.

In order to make objects, technical details and advantages of the present disclosure apparent, the embodiments of the present disclosure will be described in further detail below in conjunction with the drawings.

The transistors used in all embodiments of the present disclosure may be thin film transistors or field effect transistors or other devices with the same characteristics, and the transistors used in the embodiments of the present disclosure are mainly switching transistors according to their functions in circuits. Because the source electrode and the drain electrode of the switching transistor used herein are symmetrical, the source drain and the drain electrode are interchangeable. In the embodiments of the present disclosure, the source drain is referred to as a first electrode and the drain electrode is referred to as a second electrode; however, it should be understood that in other embodiments, the source electrode may also be a second electrode and the drain electrode may also be a first electrode, and the embodiments of the present disclosure are not limited thereto. According to the shape in the drawings, the middle terminal of the transistor is a gate electrode, the signal input terminal is a source electrode and the signal output end is a drain electrode. In addition, the switching transistors used in the embodiments of the present disclosure may include P-type switching transistors and N-type switching transistors, wherein the P-type switching transistors are turned on when the gate electrodes are at a low level and turned off when the gate electrodes are at a high level, while the N-type switching transistors are turned on when the gate electrodes are at a high level and turned off when the gate electrodes are at a low level. In addition, a plurality of signals in various embodiments of the present disclosure each correspond to a high potential and a low potential, and the effective potential of the signals is a potential that turns on the switching transistor, for example, for a P-type switching transistor, the low potential is an effective potential, and for an N-type switching transistor, the high potential is an effective potential.

In the embodiments of the present disclosure, for example, when each circuit is implemented by N-type transistors, the term "pull-up" means charging a node or an electrode of a transistor so as to increase the absolute value of the level of the node or the electrode, thereby realizing the operation (e.g., turning-on) of the corresponding transistor; the term "pull-down" refers to discharging a node or an electrode of a transistor so as to decrease the absolute value of the level of the node or the electrode, thereby realizing the operation (e.g., turning-off) of the corresponding transistor.

For another example, when each circuit is implemented as P-type transistors, the term "pull-up" means discharging a node or an electrode of a transistor so as to decrease the absolute value of the level of the node or the electrode, thereby realizing the operation (e.g., turning-on) of the corresponding transistor; the term "pull-down" means charging a node or an electrode of a transistor so as to increase the absolute value of the level of the node or the electrode, thereby realizing the operation (e.g., turning-off) of the corresponding transistor.

In addition, the specific meanings of the terms "pull-up" and "pull-down" will also be adjusted according to the specific type of the transistor used, as long as the control of the transistor may be realized and the corresponding switching function may be achieved. As mentioned above, the shift register units in the related art usually include many elements, resulting in a great area occupied by the gate driver on array in the display device.

At least one embodiment of the present disclosure provides a shift register unit comprising:

an input sub-circuit connected to an input signal terminal, a first clock signal terminal and a first node, the input sub-circuit being configured for inputting an input signal from the input signal terminal to the first node under a control of a first clock signal from the first clock signal terminal;

an output sub-circuit connected to a second clock signal terminal, the first node and an output terminal, the output sub-circuit being configured for inputting a second clock signal from the second clock signal terminal to the output terminal under a control of the first node;

a control sub-circuit connected to the first clock signal terminal, the first node, a power supply terminal and a second node, the control sub-circuit being configured for inputting the first clock signal to the second node under a control of the first clock signal, and for inputting a power supply signal from the power supply terminal to the second node under a control of the first node; and a holding sub-circuit connected to the power supply terminal, the second node and the output terminal, the holding sub-circuit being configured for inputting the power supply signal to the output terminal under the control of the second node.

FIG. 1 is a schematic structural diagram of a shift register unit provided by the embodiments of the present disclosure. Referring to FIG. 1, the shift register unit may comprise: an input sub-circuit 10, an output sub-circuit 20, a pull-down control sub-circuit 30, and a pull-down sub-circuit 40.

The input sub-circuit 10 is connected to an input signal terminal IN, a first clock signal terminal CLK1 and a pull-up node Q. The input sub-circuit 10 is used to input an input signal from the input signal terminal IN to the pull-up node Q under the control of the first clock signal from the first clock signal terminal CLK1. The pull-up node Q is a particular example of the above-mentioned first node.

For example, when the potential of the first clock signal is an effective potential and the potential of the input signal is an effective potential, the input sub-circuit 10 is used to input the input signal at the effective potential to the pull-up node Q. When the potential of the first clock signal is an effective potential and the potential of the input signal is an invalid potential, the input sub-circuit 10 is used to input the input signal at the invalid potential to the pull-up node Q.

The output sub-circuit 20 is connected to a second clock signal terminal CLK2, a pull-up node Q and an output terminal OUT, and the output sub-circuit 20 is used to input a second clock signal from the second clock signal terminal CLK2 to the output terminal OUT under the control of the pull-up node Q.

For example, when the potential of the pull-up node Q is an effective potential and the potential of the second clock signal is an effective potential, the output sub-circuit 20 is used to input the second clock signal at the effective potential to the output terminal OUT. When the potential of the pull-up node Q is an effective potential and the potential of the second clock signal is an invalid potential, the output sub-circuit 20 is used to input the second clock signal at the invalid potential to the output terminal OUT.

The pull-down control sub-circuit 30 is connected to the first clock signal terminal CLK1, the pull-up node Q, the power supply terminal VGL and the pull-down node P. The pull-down control sub-circuit 30 is used to input the first clock signal to the pull-down node P under the control of the first clock signal, and to input the power supply signal from the power supply terminal VGL to the pull-down node P under the control of the pull-up node Q. Moreover, when the pull-down sub-circuit 40 inputs the first clock signal to the pull-down node P and the pull-down sub-circuit 40 inputs the power supply signal to the pull-down node P, the pull-down node P remains at an invalid potential. The potential of the power supply signal is an invalid potential. The pull-down node P is a particular example of the above-mentioned second node, and the pull-down control sub-circuit 30 is a particular example of the above-mentioned control sub-circuit.

The pull-down sub-circuit 40 is connected to the power supply terminal VGL, the pull-down node P and the output terminal OUT, and the pull-down sub-circuit 40 is used to input a power supply signal to the output terminal OUT under the control of the pull-down node P. The pull-down sub-circuit 40 is a particular example of the holding sub-circuit described above.

It should be understood that certain terms are used in the present disclosure for the purposes of illustration and should not be construed as limiting the present disclosure. For example, when the shift register unit provided by the embodiments of the present disclosure is implemented by different types of transistors, the above-mentioned "pull-up node," "pull-down node," "pull-down control sub-circuit" and "pull-down sub-circuit" may also be referred to as "pull-down node," "pull-up node," "pull-up control sub-circuit" and "pull-up sub-circuit."

In summary, the shift register unit provided by the embodiments of the present disclosure includes an input sub-circuit, an output sub-circuit, a pull-down control sub-circuit and a pull-down sub-circuit. The circuit structure of the shift register unit is simple, and the input sub-circuit in the shift register unit may charge and reset the pull-up node according to the potential of the input signal without additionally arranging a circuit for resetting the pull-up node. Compared with the related art, the number of elements in the shift register unit and the space occupied by signal lines are reduced, thereby effectively reducing the area occupied by the gate driver on array in the display device and helping realize a narrow bezel.

Figure 2:
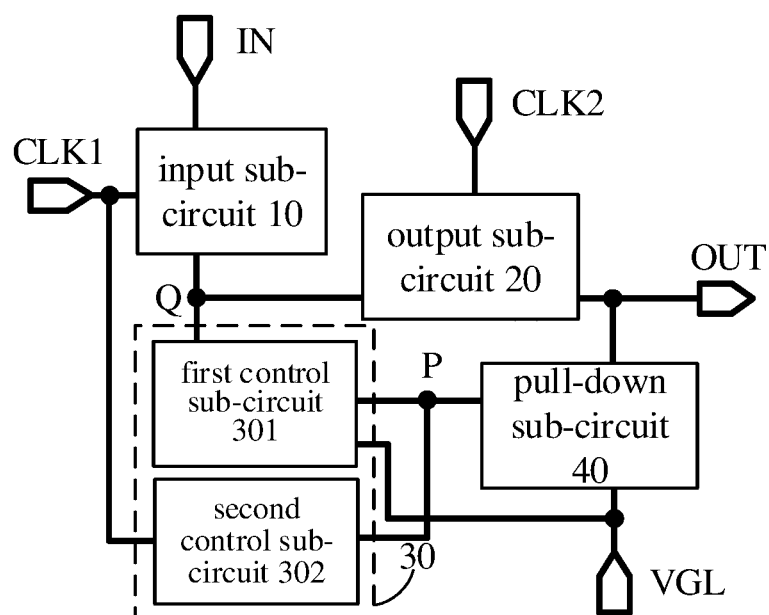
FIG. 2 is a schematic structural diagram of another shift register unit provided by the embodiments of the present disclosure.

FIG. 2 is a schematic structural diagram of another shift register unit provided by some embodiments of the present disclosure. Referring to FIG. 2, in some embodiments of the present disclosure, the pull-down control sub-circuit 30 includes a first control sub-circuit 301 and a second control sub-circuit 302.

The first control sub-circuit 301 is connected to the pull-up node Q, the pull-down node P and the power supply terminal VGL, and the first control sub-circuit 301 is used to input a power supply signal to the pull-down node P under the control of the pull-up node Q.

The second control sub-circuit 302 is connected to the first clock signal terminal CLK1 and the pull-down node P, and the second control sub-circuit 302 is used to input the first clock signal to the pull-down node P under the control of the first clock signal.

Figure 3:
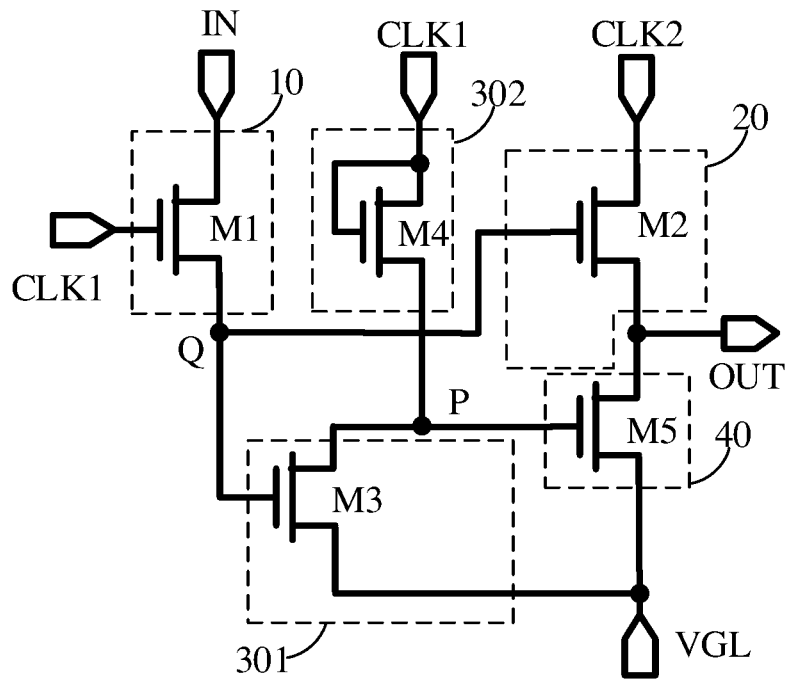
FIG. 3 is a schematic structural diagram of another shift register unit provided by the embodiments of the present disclosure.

FIG. 3 is a schematic structural diagram of another shift register unit provided by some embodiments of the present disclosure. Optionally, referring to FIG. 3, in some embodiments of the present disclosure, the first control sub-circuit 301 includes a third transistor M3.

The gate electrode of the third transistor M3 is connected to the pull-up node Q, the first electrode of the third transistor M3 is connected to the power supply terminal VGL, and the second electrode of the third transistor M3 is connected to the pull-down node P.

Further referring to FIG. 3, in some embodiments of the present disclosure, the second control sub-circuit 302 includes a fourth transistor M4.

The gate electrode and the first electrode of the fourth transistor M4 are both connected to the first clock signal terminal CLK1, and the second electrode of the fourth transistor M4 is connected to the pull-down node P.

Referring to FIG. 3, in some embodiments of the present disclosure, the input sub-circuit 10 may include a first transistor M1. The gate electrode of the first transistor M1 is connected to the first clock signal terminal CLK1, the first electrode of the first transistor M1 is connected to the input signal terminal IN, and the second electrode of the first transistor M1 is connected to the pull-up node Q. The input sub-circuit 10 may charge and reset the pull-up node Q according to the potential of the input signal, thereby reducing the number of elements in the shift register unit and the space occupied by signal lines.

Optionally, further referring to FIG. 3, in some embodiments of the present disclosure, the output sub-circuit 20 includes a second transistor M2. The gate electrode of the second transistor M2 is connected to the pull-up node Q, the first electrode of the second transistor M2 is connected to the second clock signal terminal CLK2, and the second electrode of the second transistor M2 is connected to the output terminal OUT.

Figure 4:
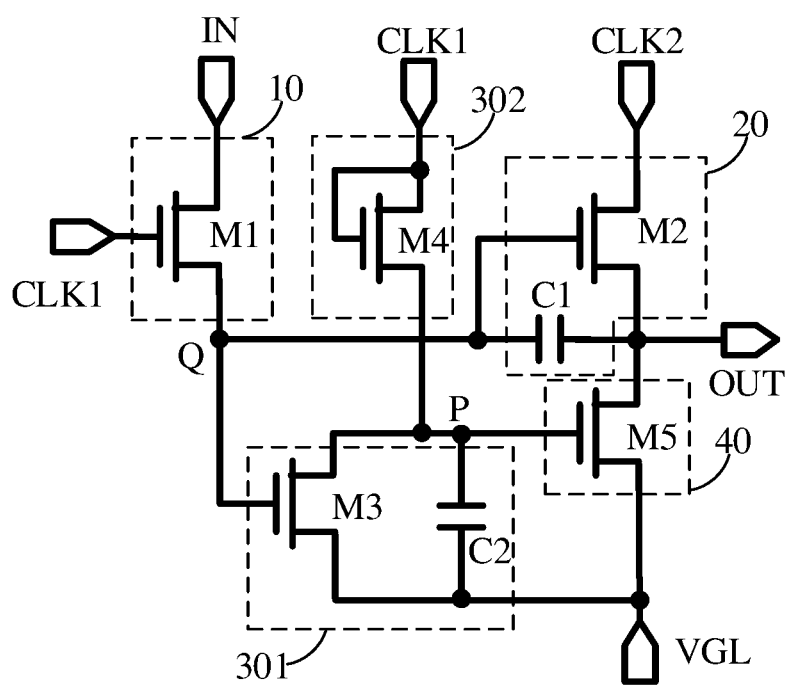
FIG. 4 is a schematic structural diagram of another shift register unit provided by the embodiments of the present disclosure.

FIG. 4 is a schematic structural diagram of another shift register unit provided by some embodiments of the present disclosure. Referring to FIG. 4, in some embodiments of the present disclosure, the output sub-circuit 20 further includes a first capacitor C1. An end of the first capacitor C1 is connected to the pull-up node Q, and the other end of the first capacitor C1 is connected to the output terminal OUT. The first capacitor C1 can further increase the voltage of the pull-up node Q to keep the second transistor M2 in a turned-on state, thereby ensuring the stable output of the output sub-circuit 20.

Optionally, further referring to FIG. 4, in some embodiments of the present disclosure, the pull-down control sub-circuit 30 further includes a second capacitor C2. An end of the second capacitor C2 is connected to the pull-down node P, and the other end of the second capacitor C2 is connected to the power supply terminal VGL. The second capacitor C2 is used to stabilize the voltage of the pull-down node P.

Further referring to FIG. 3 and FIG. 4, in some embodiments of the present disclosure, the pull-down sub-circuit 40 includes a fifth transistor M5.

The gate electrode of the fifth transistor M5 is connected to the pull-down node P, the first electrode of the fifth transistor M5 is connected to the power supply terminal VGL, and the second electrode of the fifth transistor M5 is connected to the output terminal OUT.

In summary, the shift register unit provided by the embodiments of the present disclosure includes an input sub-circuit, an output sub-circuit, a pull-down control sub-circuit and a pull-down sub-circuit. The circuit structure of the shift register unit is simple, and the input sub-circuit in the shift register unit may charge and reset the pull-up node according to the potential of the input signal without additionally arranging a circuit for resetting the pull-up node. Compared with the related art, the number of elements in the shift register unit and the space occupied by signal lines are reduced, thereby effectively reducing the area occupied by the gate driver on array in the display device and helping realize a narrow bezel.

At least one embodiment of the present disclosure further provides a method of driving a shift register unit, which is configured for driving any one of the shift register units described above. The method includes: in a potential control phase, inputting a first clock signal at an effective potential to a first clock signal terminal, and inputting an input signal at an effective potential to an input signal terminal, so that the input sub-circuit inputs an input signal at the effective potential to a first node under a control of the first clock signal; in an output phase, inputting a second clock signal at an effective potential to a second clock signal terminal, so that the output sub-circuit inputs a second clock signal at an effective potential to an output terminal under a control of the first node at the effective potential; in a reset phase, inputting the second clock signal at an invalid potential to a second clock signal terminal, so that the output sub-circuit inputs the second clock signal at the invalid potential to an output terminal under the control of the first node at the effective potential; in a holding phase, inputting the first clock signal at an effective potential to a first clock signal terminal, inputting the input signal at an invalid potential to an input signal terminal, and inputting a power supply signal at the invalid potential to a power supply terminal, so that the input sub-circuit inputs the input signal at the invalid potential to the first node under a control of the first clock signal, the control sub-circuit inputs the first clock signal at the effective potential to the second node under the control of the first clock signal, and the holding sub-circuit inputs the power supply signal at the invalid potential to the output terminal under a control of the second node.

Figure 5:
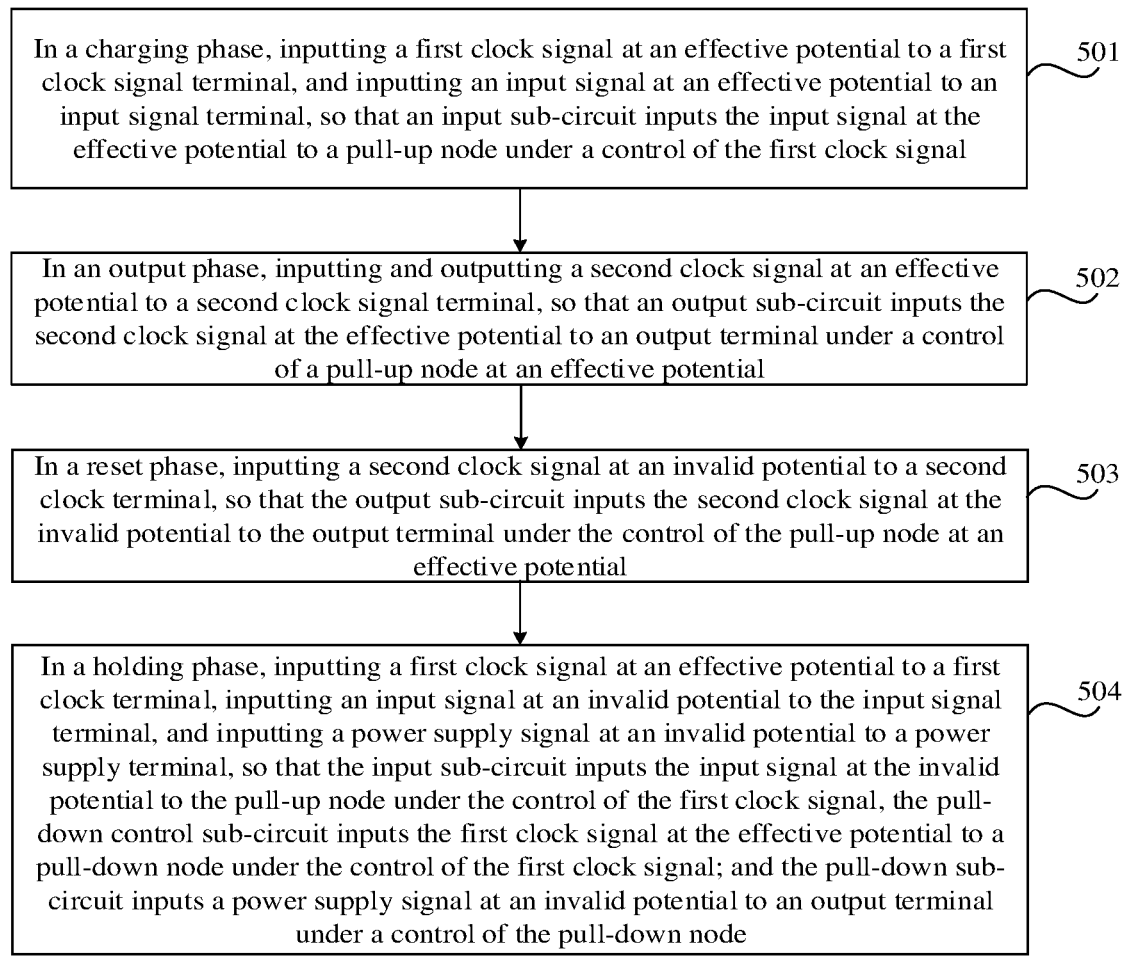
FIG. 5 is a flowchart of a method of driving a shift register unit provided by the embodiments of the present disclosure.

FIG. 5 is a flowchart of a method of driving a shift register unit provided by the embodiments of the present disclosure. The method may be used for driving a shift register unit as shown in any one of FIG. 1 to FIG. 4. The shift register unit includes: the input sub-circuit 10, the output sub-circuit 20, the pull-down control sub-circuit 30, and the pull-down sub-circuit 40. As shown in FIG. 5, the method may include the following steps.

Step 501: in a charging phase, inputting a first clock signal at an effective potential to a first clock signal terminal, and inputting an input signal at an effective potential to an input signal terminal, so that an input sub-circuit inputs the input signal at the effective potential to a pull-up node under a control of the first clock signal. The charging phase is a particular example of the above-mentioned potential control phase.

Step 502: in an output phase, inputting a second clock signal at an effective potential to a second clock signal terminal, so that an output sub-circuit inputs the second clock signal at the effective potential to an output terminal under a control of a pull-up node at an effective potential. The output phase is a particular example of the above-mentioned output phase.

Step 503: in a reset phase, inputting a second clock signal at an invalid potential to a second clock signal terminal, so that the output sub-circuit inputs the second clock signal at the invalid potential to the output terminal under the control of the pull-up node at an effective potential. The reset phase is a particular example of the above reset phase.

Step 504: in a holding phase, inputting a first clock signal at an effective potential to a first clock signal terminal, inputting an input signal at an invalid potential to the input signal terminal, and inputting a power supply signal at an invalid potential to a power supply terminal, so that the input sub-circuit inputs the input signal at the invalid potential to the pull-up node under the control of the first clock signal, the pull-down control sub-circuit inputs the first clock signal at the effective potential to a pull-down node under the control of the first clock signal, and the pull-down sub-circuit inputs a power supply signal at an invalid potential to an output terminal under a control of the pull-down node. The holding phase is a particular example of the above-mentioned holding phase.

Further, the pull-down control sub-circuit 30 comprises a first control sub-circuit 301 and a second control sub-circuit 302. Accordingly, the method further comprises the following.

In the charging phase, the first control sub-circuit 301 inputs a power supply signal at an invalid potential to the pull-down node P under the control of the pull-up node Q at an effective potential, and the second control sub-circuit 302 inputs a first clock signal at an effective potential to the pull-down node P under the control of the first clock signal at an effective potential to control the potential of the pull-down node P to be an invalid potential.

In the output phase, the first control sub-circuit 301 inputs a power supply signal at an invalid potential to the pull-down node P under the control of the pull-up node Q at the effective potential, and the second control sub-circuit 302 is turned off (i.e., does not output a signal) under the control of the first clock signal at the invalid potential.

In the reset phase, the first control sub-circuit 301 inputs a power supply signal at an invalid potential to the pull-down node P under the control of the pull-up node Q at the effective potential, and the second control sub-circuit 302 is turned off (i.e., does not output a signal) under the control of the first clock signal at the invalid potential.

In the holding phase, the first control sub-circuit 301 is turned off (i.e., does not input a signal) under the control of the pull-up node Q at the invalid potential, and the second control sub-circuit 302 inputs the first clock signal at the effective potential to the pull-down node P under the control of the first clock signal at the effective potential.

In summary, in the method of driving the shift register unit provided by the embodiments of the present disclosure: in the reset phase, the output sub-circuit inputs a second clock signal at an invalid potential to the output terminal under the control of the pull-up node at an effective potential to reset the output terminal so that the thin film transistor in the display area is kept in a turned-off state; and in the holding phase, the input sub-circuit inputs an input signal at an invalid potential to the pull-up node under the control of the first clock signal; under the control of the first clock signal, the pull-down control sub-circuit inputs a first clock signal at an effective potential to the pull-down node; and the pull-down sub-circuit inputs a power supply signal at an invalid potential to the output terminal under the control of the pull-down node, so that the potential of the output terminal is kept at the invalid potential, thereby realizing continuous noise reduction on the output terminal.

Figure 6:
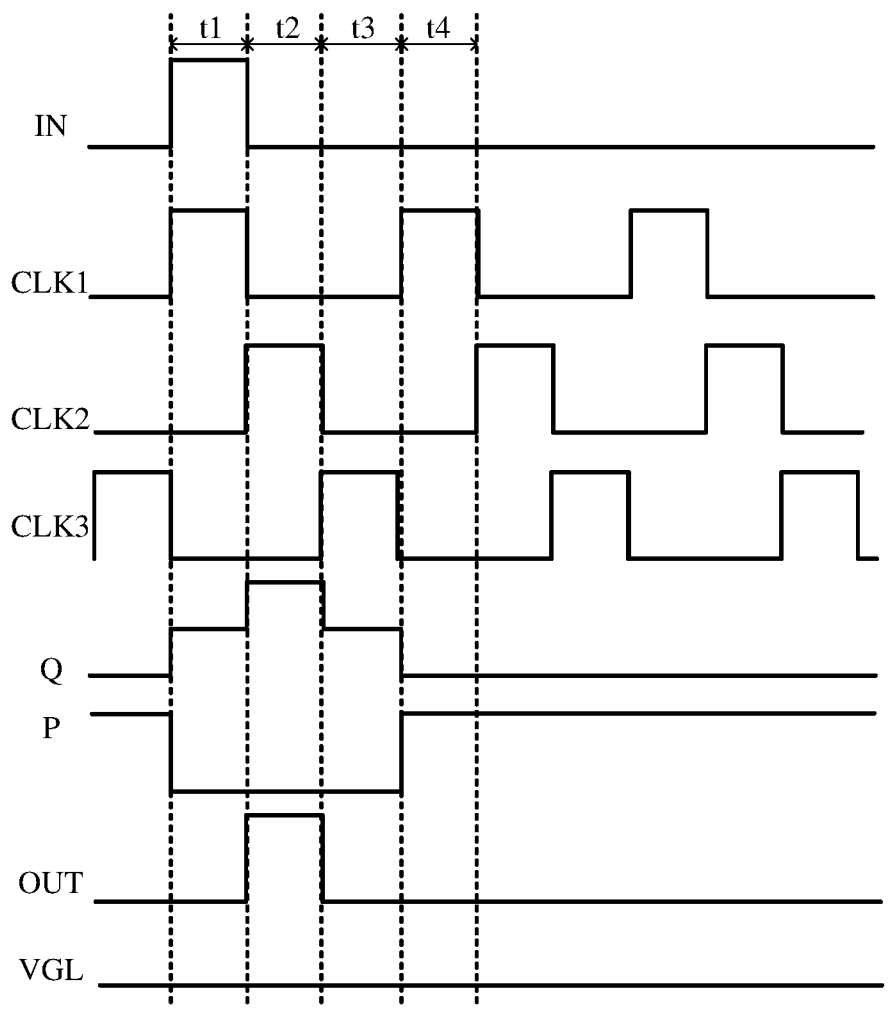
FIG. 6 is a timing diagram of a driving process of a shift register unit provided by the embodiments of the present disclosure.

For example, FIG. 6 is a timing diagram of a driving process of a shift register unit provided by the embodiments of the present disclosure. The driving principle of the shift register unit provided by the embodiments of the present disclosure is described in detail by taking the shift register unit shown in FIG. 4 with each transistor in the shift register unit being an n-type transistor and the effective potential being a high potential relative to the invalid potential, as an example.

Referring to FIG. 6, in the charging phase t1, the potential of the first clock signal input from the first clock signal terminal CLK1 is an effective potential, the potential of the second clock signal input from the second clock signal terminal CLK2 is an invalid potential, the potential of the input signal input from the input signal terminal is an effective potential, the potential of the power supply signal input from the power supply terminal VGL is an invalid potential, and the first transistor M1 is turned on under the control of the first clock signal. The input signal terminal IN inputs an input signal at an effective potential to the pull-up node Q through the first transistor M1, charges the pull-up node Q, and keeps the potential of the pull-up node Q at an effective potential. Correspondingly, the second transistor M2 is slightly turned on under the control of the pull-up node Q at the effective potential, and the second clock signal terminal CLK2 inputs the second clock signal at the invalid potential to the output terminal OUT through the second transistor M2.

Furthermore, under the control of the pull-up node Q at the effective potential, the third transistor M3 is turned on, and the power supply terminal VGL inputs the power supply signal at the invalid potential to the pull-down node P through the third transistor M3. At the same time, under the control of the first clock signal at the effective potential, the fourth transistor M4 is turned on, and the first clock signal terminal CLK1 inputs the first clock signal at the effective potential to the pull-down node P through the fourth transistor M4. In this case, under the combined action of the power supply signal and the first clock signal, the potential of the pull-down node P remains at the invalid potential. Further, under the control of the potential of the pull-down node P at the invalid potential, the fifth transistor M5 is turned off, which may ensure the voltage stability of the output terminal OUT.

In one realizable way, under the combined action of the power supply signal and the first clock signal, the realizable way to keep the potential of the pull-down node P at an invalid potential may be to pre-design the channel width-to-length ratio of the third transistor M3 to be smaller than the channel width-to-length ratio of the fourth transistor M4, for example, the ratio of the channel width-to-length ratio of the third transistor M3 to the channel width-to-length ratio of the fourth transistor M4 may be 1:5, etc.

In the output phase t2, the potential of the first clock signal input from the first clock signal terminal CLK1 is an invalid potential, the potential of the input signal input from the input signal terminal IN is an invalid potential, the potential of the second clock signal input from the second clock signal terminal CLK2 is an effective potential, the potential of the power supply signal input from the power supply terminal VGL is an invalid potential, the potential of the pull-up node Q is an effective potential, and the potential of the pull-down node P is an invalid potential. Moreover, because the second transistor M2 is slightly turned on in the charging phase t1, the second clock signal terminal CLK2 inputs a second clock signal at an invalid potential to the output terminal OUT. After the second clock signal is shifted to a high level in the output phase t2, due to the coupling effect of the first capacitor C1, the potential of the pull-up node Q will further increase as the second electrode potential of the second transistor M2 increases. In this case, the second transistor M2 is completely turned on, and the second clock signal terminal CLK2 inputs a second clock signal at an effective potential to the output terminal OUT through the second transistor M2 to drive pixel cells in the display panel.

Meanwhile, in the output phase t2, the third transistor M3 is turned on under the control of the pull-up node Q at the effective potential, and the power supply terminal VGL inputs the power supply signal at the invalid potential to the pull-down node P through the third transistor M3, so that the potential of the pull-down node P is maintained at the invalid potential.

In the reset phase t3, the potential of the first clock signal input from the first clock signal terminal CLK1 is an invalid potential, the potential of the input signal input from the input signal terminal is an invalid potential, the potential of the second clock signal input from the second clock signal terminal CLK2 is an invalid potential, the potential of the power supply signal input from the power supply terminal VGL is an invalid potential, and the potential of the pull-up node Q is maintained at an effective potential. The second transistor M2 is kept turned on under the control of the pull-up node Q, and the second clock signal terminal CLK2 inputs a second clock signal at an invalid potential to the output terminal OUT through the second transistor M2 to reset the output terminal OUT, so that the thin film transistor (TFT) in the display area is kept in a turned-off state.

In the holding phase t4, the potential of the first clock signal input from the first clock signal terminal CLK1 is an effective potential, the potential of the input signal input from the input signal terminal is an invalid potential, the potential of the second clock signal input from the second clock signal terminal CLK2 is an invalid potential, the potential of the power supply signal input from the power supply terminal VGL is an invalid potential, the first transistor M1 is turned on under the control of the first clock signal, and the input signal terminal IN inputs the input signal at the invalid potential to the pull-up node Q through the first transistor M1, so as to realize resetting of the pull-up node Q.

At the same time, the fourth transistor M4 is turned on under the control of the first clock signal. The first clock signal terminal CLK1 inputs a first clock signal at an effective potential to the pull-down node P through the fourth transistor M4, and charges the second capacitor C2 to keep the potential of the pull-down node P at an effective potential. The fifth transistor M5 is turned on under the control of the pull-down node P at an effective potential. The power supply terminal VGL inputs a power supply signal at an invalid potential to the output terminal OUT through the fifth transistor M5 to keep the potential of the output terminal OUT at an invalid potential, thus realizing continuous noise reduction on the output terminal OUT.

It should be noted that the particular level values of the signals output by the power supply terminals VGL and the signal terminals may be adjusted according to actual circuit requirements, for example, the level of the first power supply signal may be 8 volts (V) and the level of the second power supply signal may be −8V, which are not limited by the embodiments of the present disclosure.

In summary, in the method of driving the shift register unit provided by the embodiments of the present disclosure: in the reset phase, the output sub-circuit inputs a second clock signal at an invalid potential to the output terminal under the control of the pull-up node at an effective potential to reset the output terminal so that the thin film transistor in the display area is kept in a turned-off state; and in the holding phase, the input sub-circuit inputs an input signal at an invalid potential to the pull-up node under the control of the first clock signal; under the control of the first clock signal, the pull-down control sub-circuit inputs a first clock signal at an effective potential to the pull-down node; and the pull-down sub-circuit inputs a power supply signal at an invalid potential to the output terminal under the control of the pull-down node, so that the potential of the output terminal is kept at an invalid potential, thereby realizing continuous noise reduction on the output terminal.

Embodiments of the present disclosure provide a gate driver on array, which may include a plurality of cascaded shift register units, and each shift register unit is a shift register unit shown in any one of FIG. 1 to FIG. 4.

Optionally, in the plurality of cascaded shift register units, the output terminal OUT of the $i^{th}$ shift register unit is connected to the input signal terminal IN of the $(j+1)^{th}$ shift register unit, and j is a positive integer.

Figure 7:
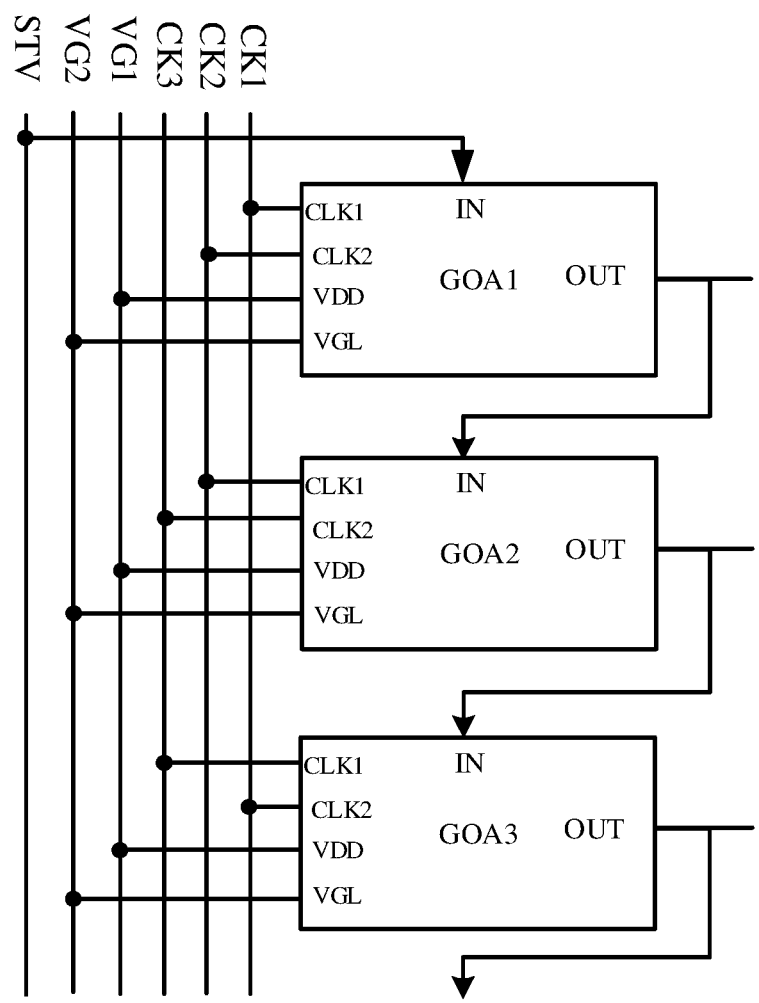
FIG. 7 is a schematic structural diagram of a gate driver on array provided by the embodiments of the present disclosure.

For example, FIG. 7 is a schematic diagram of a partial structure of a gate driver on array provided by the embodiments of the present disclosure. The structure shown in FIG. 7 comprises three cascaded shift register units, and each of the three cascaded shift register units may be the shift register unit shown in any one of FIG. 1 to FIG. 4. As shown in FIG. 7, the gate driver on array may be provided with a start signal terminal, three clock signal terminals, an effective potential power supply signal terminal VG1 and an invalid potential power supply signal terminal VG2; the power supply terminal VGL of each shift register unit is connected to the invalid potential power supply terminal VG2, and the power supply terminal VDD of each shift register unit is connected to the effective potential power supply signal terminal VG1, and the effective potential power supply signal terminal VG1 is configured for supplying power to the shift register unit. The start signal terminal outputs a start signal STV, and the three clock signal terminals respectively output clock signals CK1, CK2 and CK3, the duty ratios of the clock signals CK1, CK2 and CK3 are the same, and CK1, CK2 and CK3 sequentially output clock signals at effective potentials. In the three cascaded shift register units, the input signal input by the input signal terminal IN of a first-stage shift register unit GOAL is a start signal STV. The first clock signal input from a first clock signal terminal CLK1 of the first-stage shift register unit GOAL is a clock signal CK1, and the second clock signal input from a second clock signal terminal CLK2 of the first-stage shift register unit GOAL is a clock signal CK2; the input signal input by the input signal terminal IN of a second-stage shift register unit GOA2 is the output signal of the first-stage shift register unit GOA1, the first clock signal input by the first clock signal terminal CLK1 of the second-stage shift register unit GOA2 is the clock signal CK2, and the second clock signal input by the second clock signal terminal CLK2 of the second-stage shift register unit GOA2 is a clock signal CK3; the input signal input from the input signal terminal IN of a third-stage shift register unit GOA3 is the output signal of the second-stage shift register unit GOA2, the first clock signal input from the first clock signal terminal CLK1 of the third-stage shift register unit GOA3 is the clock signal CK3, and the second clock signal input from the second clock signal terminal CLK2 of the third-stage shift register unit GOA3 is the clock signal CK1. The above connection may be repeated in the gate driver on array provided by the embodiments of the present disclosure by taking three shift register units as a group.

To sum up, the gate driver on array provided by the embodiments of the present disclosure comprises a plurality of cascaded shift register units, and each shift register unit comprises an input sub-circuit, an output sub-circuit, a pull-down control sub-circuit and a pull-down sub-circuit. The circuit structure of the shift register unit is relatively simple, and the input sub-circuit in the shift register unit may charge and reset the pull-up node according to the potential of the input signal without additionally arranging a circuit for resetting the pull-up node. Compared with the related technology, the number of elements in the shift register unit and the space occupied by signal lines are reduced, thus effectively reducing the area occupied by the gate driver on array in the display device and helping realize a narrow bezel.

The embodiments of the present disclosure provide a display device, which may include the gate driver on array provided by the embodiments of the present disclosure. The display device may be any product or component with a display function such as a liquid crystal panel, an electronic paper, an organic light-emitting diode (OLED) panel, a mobile phone, a tablet PC, a television, a display, a laptop, a digital photo frame, a navigator, or the like.

The embodiments of the present disclosure further provide a non-volatile storage medium storing a computer program which, when executed by a processor, performs the method of driving the shift register unit provided by the embodiments of the present disclosure.

The above description is only the optional embodiment of the present disclosure and is not intended to limit the present disclosure. Any modifications, equivalent substitutions, improvements, and the like made within the spirit and principles of the present disclosure shall fall within the protection scope of the present disclosure.

What is claimed is:

1. A shift register unit, comprising:
an input sub-circuit connected to an input signal terminal, a first clock signal terminal and a first node, the input sub-circuit being configured for inputting an input signal from the input signal terminal to the first node under a control of a first clock signal from the first clock signal terminal;
an output sub-circuit connected to a second clock signal terminal, the first node and an output terminal, the output sub-circuit being configured for inputting a second clock signal from the second clock signal terminal to the output terminal under a control of the first node;
a control sub-circuit connected to the first clock signal terminal, the first node, a power supply terminal and a second node, the control sub-circuit being configured for inputting the first clock signal to the second node under a control of the first clock signal, and for inputting a power supply signal from the power supply terminal to the second node under a control of the first node; and
a holding sub-circuit connected to the power supply terminal, the second node and the output terminal, the holding sub-circuit being configured for inputting the power supply signal to the output terminal under a control of the second node.

2. The shift register unit according to claim 1, wherein the input sub-circuit comprises: a first transistor; and
a gate electrode of the first transistor is connected to the first clock signal terminal, a first electrode of the first transistor is connected to the input signal terminal, and a second electrode of the first transistor is connected to the first node.

3. The shift register unit according to claim 1, wherein the output sub-circuit comprises: a second transistor; and
a gate electrode of the second transistor is connected to the first node, a first electrode of the second transistor is connected to the second clock signal terminal, and a second electrode of the second transistor is connected to the output terminal.

4. The shift register unit according to claim 3, wherein the output sub-circuit further comprises: a first capacitor; and
an end of the first capacitor is connected to the first node, and a remaining end of the first capacitor is connected to the output terminal.

5. The shift register unit according to claim 1, wherein the control sub-circuit comprises: a first control sub-circuit and a second control sub-circuit;
the first control sub-circuit is connected to the first node, the second node and the power supply terminal, and the first control sub-circuit is configured for inputting the power supply signal to the second node under the control of the first node; and
the second control sub-circuit is connected to the first clock signal terminal and the second node, and the second control sub-circuit is configured for inputting the first clock signal to the second node under the control of the first clock signal.

6. The shift register unit according to claim 5, wherein the first control sub-circuit comprises: a third transistor;
a gate electrode of the third transistor is connected to the first node, a first electrode of the third transistor is connected to the power supply terminal, and a second electrode of the third transistor is connected to the second node;
the second control sub-circuit comprises: a fourth transistor; and
a gate electrode and a first electrode of the fourth transistor are both connected to the first clock signal terminal, and a second electrode of the fourth transistor is connected to the second node.

7. The shift register unit according to claim 5, wherein the control sub-circuit further comprises: a second capacitor; and
an end of the second capacitor is connected to the second node, and a remaining end of the second capacitor is connected to the power supply terminal.

8. The shift register unit according to claim 1, wherein the holding sub-circuit comprises: a fifth transistor; and
a gate electrode of the fifth transistor is connected to the second node, a first electrode of the fifth transistor is connected to the power supply terminal, and a second electrode of the fifth transistor is connected to the output terminal.

9. A method of driving a shift register unit, the method being configured for driving the shift register unit according to claim 1, and the method comprising:
in a potential control phase, inputting the first clock signal at an effective potential to the first clock signal terminal, and inputting the input signal at the effective potential to the input signal terminal, so that the input sub-circuit inputs the input signal at the effective potential to the first node under the control of the first clock signal;

in an output phase, inputting the second clock signal at an effective potential to the second clock signal terminal, so that the output sub-circuit inputs the second clock signal at the effective potential to the output terminal under the control of the first node at the effective potential;

in a reset phase, inputting the second clock signal at an invalid potential to the second clock signal terminal, so that the output sub-circuit inputs the second clock signal at the invalid potential to the output terminal under the control of the first node at the effective potential; and in a holding phase, inputting the first clock signal at the effective potential to the first clock signal terminal, inputting the input signal at the invalid potential to the input signal terminal, and inputting the power supply signal at the invalid potential to the power supply terminal, so that the input sub-circuit inputs the input signal at the invalid potential to the first node under the control of the first clock signal; the control sub-circuit inputs the first clock signal at the effective potential to the second node under the control of the first clock signal; and the holding sub-circuit inputs the power supply signal at the invalid potential to the output terminal under the control of the second node.

10. The method according to claim 9, wherein in a case where the control sub-circuit comprises a first control sub-circuit and a second control sub-circuit, the method further comprises:

in the potential control phase, inputting, by the first control sub-circuit, the power supply signal at the invalid potential to the second node under the control of the first node at the effective potential, and inputting, by the second control sub-circuit, the first clock signal at the effective potential to the second node under the control of the first clock signal at the effective potential so as to control an potential of the second node to be the invalid potential.

11. The method according to claim 9, wherein in a case where the control sub-circuit comprises a first control sub-circuit and a second control sub-circuit, the method further comprises:

in the output phase and the reset phase, inputting, by the first control sub-circuit, the power supply signal at the invalid potential to the second node under the control of the first node at the effective potential.

12. The method according to claim 9, wherein in a case where the control sub-circuit comprises a first control sub-circuit and a second control sub-circuit, the method further comprises:

in the holding phase, inputting, by the second control sub-circuit, the first clock signal at the effective potential to the second node under the control of the first clock signal at the effective potential.

13. A gate driver on array, comprising: a plurality of cascaded shift register units according to claim 1.

14. The gate driver on array according to claim 13, wherein in the plurality of cascaded shift register units, an output terminal of a $j^{th}$ shift register unit is connected to an input signal terminal of a $(j+1)^{th}$ shift register unit, and j is a positive integer.

15. A display device, comprising the gate driver on array according to claim 13.

16. The shift register unit according to claim 2, wherein the output sub-circuit comprises: a second transistor; and a gate electrode of the second transistor is connected to the first node, a first electrode of the second transistor is connected to the second clock signal terminal, and a second electrode of the second transistor is connected to the output terminal.

17. The shift register unit according to claim 2, wherein the control sub-circuit comprises: a first control sub-circuit and a second control sub-circuit;

the first control sub-circuit is connected to the first node, the second node and the power supply terminal, and the first control sub-circuit is configured for inputting the power supply signal to the second node under the control of the first node; and the second control sub-circuit is connected to the first clock signal terminal and the second node, and the second control sub-circuit is configured for inputting the first clock signal to the second node under the control of the first clock signal.

18. The shift register unit according to claim 2, wherein the holding sub-circuit comprises: a fifth transistor; and a gate electrode of the fifth transistor is connected to the second node, a first electrode of the fifth transistor is connected to the power supply terminal, and a second electrode of the fifth transistor is connected to the output terminal.

19. The method according to claim 9, wherein the input sub-circuit comprises: a first transistor; and a gate electrode of the first transistor is connected to the first clock signal terminal, a first electrode of the first transistor is connected to the input signal terminal, and a second electrode of the first transistor is connected to the first node.

20. The method according to claim 9, wherein the output sub-circuit comprises: a second transistor; and a gate electrode of the second transistor is connected to the first node, a first electrode of the second transistor is connected to the second clock signal terminal, and a second electrode of the second transistor is connected to the output terminal.

\* \* \* \* \*